United States Patent
Bak

(10) Patent No.: US 10,355,200 B2
(45) Date of Patent: Jul. 16, 2019

(54) SEMICONDUCTOR DEVICE AND ELECTRONIC SYSTEM INCLUDING THE SAME

(71) Applicant: SAMSUNG ELECTRONICS CO., LTD., Suwon-si, Gyeonggi-do (KR)

(72) Inventor: Jung-hoon Bak, Suwon-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 15/858,348

(22) Filed: Dec. 29, 2017

(65) Prior Publication Data

US 2018/0205002 A1 Jul. 19, 2018

(30) Foreign Application Priority Data

Jan. 19, 2017 (KR) .................. 10-2017-0009377

(51) Int. Cl.
| | |
|---|---|
| H01L 43/02 | (2006.01) |
| H01L 27/22 | (2006.01) |
| H01L 43/12 | (2006.01) |
| G11C 11/16 | (2006.01) |
| H01L 43/08 | (2006.01) |

(52) U.S. Cl.
CPC ............ *H01L 43/02* (2013.01); *G11C 11/161* (2013.01); *H01L 27/226* (2013.01); *H01L 27/228* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 6,590,244 B2 | 7/2003 | Asao et al. | |
| 6,849,888 B2 | 2/2005 | Ooishi | |
| 8,415,756 B2 | 4/2013 | Tsukamoto et al. | |
| 8,686,392 B2 | 4/2014 | Tsukamoto | |
| 9,373,663 B2 | 6/2016 | Satoh et al. | |
| 9,406,875 B2 | 8/2016 | Li et al. | |
| 2012/0063194 A1* | 3/2012 | Baek ................ | G11C 5/025 365/148 |
| 2016/0093668 A1 | 3/2016 | Lu et al. | |
| 2016/0268336 A1 | 9/2016 | Shum et al. | |

FOREIGN PATENT DOCUMENTS

| | | | | |
|---|---|---|---|---|
| JP | 2005-303156 A | | 10/2005 | |
| JP | 2012-204573 | * | 1/2012 | ........ H01L 27/105 |
| JP | 2012204573 | * | 10/2012 | |
| JP | 2013-065778 A | | 4/2013 | |

* cited by examiner

*Primary Examiner* — James G Norman
(74) *Attorney, Agent, or Firm* — Lee & Morse, P.C.

(57) ABSTRACT

A semiconductor device including a semiconductor substrate having a first region and a second region; a magnetic tunnel junction in the first region, the magnetic tunnel junction including a lower magnetic structure, a tunnel barrier, and an upper magnetic structure that are sequentially stacked; a first via plug in the second region, the first via plug including a same material as the lower magnetic structure; and a conductor wire on the first via plug.

19 Claims, 17 Drawing Sheets

FIRST REGION | SECOND REGION

SEMICONDUCTOR DEVICE AND ELECTRONIC SYSTEM INCLUDING THE SAME

CROSS-REFERENCE TO RELATED APPLICATION

Korean Patent Application No. 10-2017-0009377, filed on Jan. 19, 2017, in the Korean Intellectual Property Office, and entitled: "Semiconductor Device and Electronic System Including the Same," is incorporated by reference herein in its entirety.

BACKGROUND

1. Field

Embodiments relate to a semiconductor device and an electronic system including the same.

2. Description of the Related Art

Semiconductor devices may include via holes in which conductors are embedded.

SUMMARY

The embodiments may be realized by providing a semiconductor device including a semiconductor substrate having a first region and a second region; a magnetic tunnel junction in the first region, the magnetic tunnel junction including a lower magnetic structure, a tunnel barrier, and an upper magnetic structure that are sequentially stacked; a first via plug in the second region, the first via plug including a same material as the lower magnetic structure; and a conductor wire on the first via plug.

The embodiments may be realized by providing a semiconductor device including a select element; a memory element electrically connected to the select element; a logic device; and a via plug electrically connected to the logic device, wherein the memory element includes a lower magnetic structure, a tunnel barrier, and an upper magnetic structure, the via plug includes substantially the same material as the lower magnetic structure, and a height of the lower magnetic structure and a height of the via plug are substantially equal to each other.

The embodiments may be realized by providing a semiconductor device including a substrate that includes a memory region and a logic region; a select element on the memory region of the substrate; a memory element electrically connected to the select element; a logic device on the logic region of the substrate; and a first via plug electrically connected to the logic device, wherein the memory element includes a lower magnetic structure, a tunnel barrier, and an upper magnetic structure, the first via plug has substantially the same structure as the lower magnetic structure, and the logic region of the substrate does not include the tunnel barrier or the upper magnetic structure thereon.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
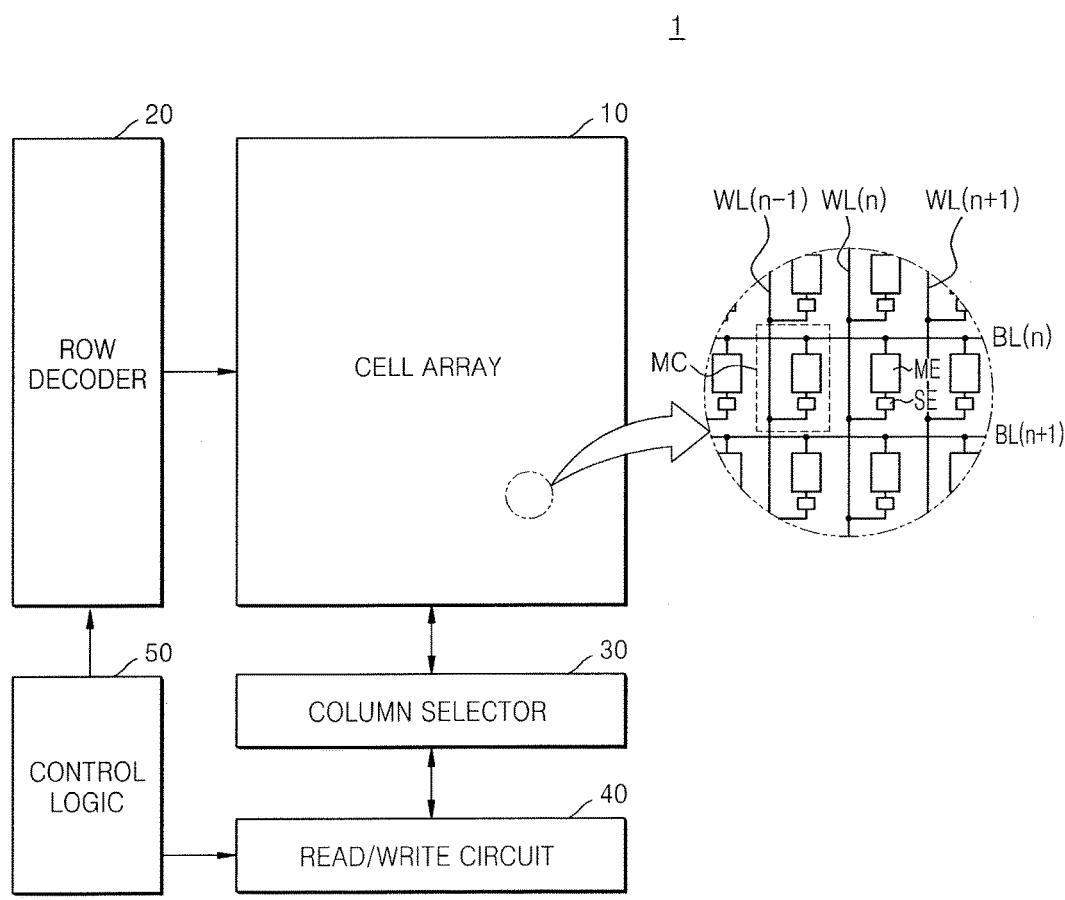
FIG. 1 illustrates a block diagram of a semiconductor device according to an embodiment.

FIG. 1 illustrates a block diagram of a semiconductor device 1 according to an embodiment.

Referring to FIG. 1, the semiconductor device 1 may include a memory cell array 10, a row decoder 20, a column selector 30, a read/write circuit 40, and a control logic 50.

The cell array 10 may include a plurality of first conductive lines, a plurality of second conductive lines, and unit memory cells MC. The first conductive lines may be word lines WL(n−1), WL(n), and WL(n+1), and the second conductive lines may be bit lines BL(n) and BL(n+1). The unit memory cells MC may be arranged two-dimensionally (2D) or three-dimensionally (3D). The unit memory cells MC may be connected between the word lines WL(n−1), WL(n), and WL(n+1) and the bit lines BL(n) and BL(n+1), which cross each other. Each of the word lines WL(n−1), WL(n), and WL(n+1) may connect the plurality of unit memory cells MC. The unit memory cells MC connected to each other by the word lines WL(n−1), WL(n), and WL(n+1) may be connected to each of the bit lines BL(n) and BL(n+1). Each of the bit lines BL(n) and BL(n+1) may be connected to each of the unit memory cells MC connected to each other by the word lines WL(n−1), WL(n), and WL(n+1). Accordingly, each of the unit memory cells MC connected to each other by the word lines WL(n−1), WL(n), and WL(n+1) may be connected to the read/write circuit 40 described above with reference to FIG. 1, by each of the bit lines BL(n) and BL(n+1).

Each of the unit memory cells MC may include a memory element ME and a select element SE. The memory element ME may be connected between the bit lines BL(n) and BL(n+1) and the select element SE, and the select element may be connected between the memory element ME and the word lines WL(n−1), WL(n), and WL(n+1). According to an embodiment, the memory element ME may be a variable resistance element that may be switched between two resistance states according to an electric pulse or current applied thereto.

According to an embodiment, the memory element ME may have a thin-film structure such that an electric resistance of the memory element ME may change via a spin transfer process according to a current passing therethrough. The thin-film structure of the memory element ME may be configured to have a magneto-resistance characteristic, and may include at least one ferromagnetic material and/or at least one anti-ferromagnetic material.

The select element SE may be configured to selectively control a flow of charges passing through the memory element ME. According to an embodiment, the select element may be one of a diode, a PNP bipolar transistor, an NPN bipolar transistor, an n-channel metal oxide semiconductor (nMOS) field-effect transistor, and an pMOS field-effect transistor. When the select element SE is a bipolar transistor or a MOS field-effect transistor, which is a three-terminal element, an additional wire may be connected to the select element SE.

The row decoder 20 may be connected to the cell array 10 through the word lines WL(n−1), WL(n), and WL(n+1). The row decoder 20 may select one of the plurality of word lines by decoding an address input from an external source.

The column selector 30 may be connected to the cell array 10 through the bit lines and may select one of the bit lines by decoding an address input from an external source. A bit line selected by the column selector 30 may be connected to the read/write circuit 40.

The read/write circuit 40 may provide a bit line bias for accessing a memory cell selected according to control of the control logic 50. The read/write circuit 40 may provide a bit line voltage to the selected bit line to write or read input data on or from a memory cell.

The control logic 50 may output control signals for controlling the semiconductor device 1 according to a command signal provided from an external source. The control signals output from the control logic 50 may control the read/write circuit 40.

Figure 2A:
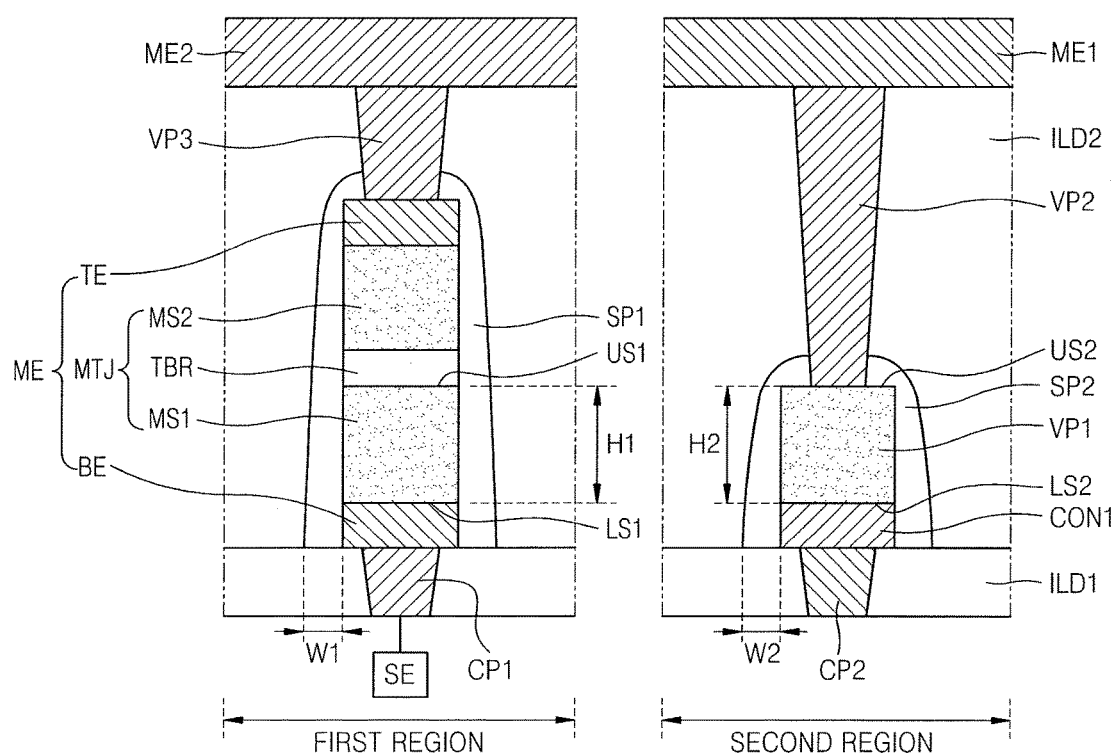
FIG. 2A illustrates a cross-sectional view of portions of a first region and a second region of a semiconductor device, according to an embodiment.

FIG. 2A illustrates a cross-sectional view of portions of a first region and a second region of the semiconductor device 1, according to an embodiment.

Referring to FIG. 2A, the semiconductor device 1 according to an embodiment may include the first region and the second region. The first region may be, e.g., a portion of the cell array 10 of FIG. 1. The second region may be, e.g., a portion corresponding to the control logic 50 of FIG. 1.

The memory element ME may include a magnetic tunnel junction MTJ, and a lower electrode BE and an upper electrode TE, which are electrically connected to the magnetic tunnel junction MTJ. The memory element ME may be provided in the first region.

According to an embodiment, the memory element ME (e.g., the magnetic tunnel junction MTJ may include a lower magnetic structure MS1, an upper magnetic structure MS2, and a tunnel barrier TBR therebetween. The lower magnetic structure MS1, the upper magnetic structure MS2, and the tunnel barrier TBR may be defined as a magnetic tunnel junction pattern. Each of the lower and upper magnetic structures MS1 and MS2 may include at least one magnetic layer formed of a magnetic material. The memory element ME may include the lower electrode BE between the lower magnetic structure MS1 and the select element SE, and the upper electrode TE between the upper magnetic structure MS2 and a bit line (e.g., the bit lines BL(n) and BL(n+1) of FIG. 1).

A magnetization direction of one of the magnetic layer of the lower magnetic structure MS1 and the magnetic layer of the upper magnetic structure MS2 may be fixed regardless of an external magnetic field, under a general usage environment. The magnetic layer having such a fixed magnetization characteristic is defined as a pinned layer. A magnetization direction of the other one of the magnetic layer of the lower magnetic structure MS1 and the magnetic layer of the upper magnetic structure MS2 may be switched by an external magnetic field applied thereto. The magnetic layer having such a variable magnetization characteristic is defined as a free layer. The magnetic tunnel junction MTJ may include at least one free layer and at least one pinned layer, which are separated by the tunnel barrier TBR.

An electric resistance of the magnetic tunnel junction MTJ may be dependent upon magnetization directions of the free layer and pinned layer. In an implementation, the electric resistance of the magnetic tunnel junction MTJ may be remarkably higher when the magnetization directions of the free layer and the pinned layer are anti-parallel than when the magnetization directions are parallel. For example, the electric resistance of the magnetic tunnel junction MTJ may be adjusted by changing the magnetization direction of the free layer, and accordingly, may be used as a data storage principle of the semiconductor device 1. In an implementation, the lower magnetic structure MS1 may include the pinned layer and the upper magnetic structure MS2 may include the free layer. In an implementation, the lower magnetic structure MS1 may include the free layer and the upper magnetic structure MS2 may include the pinned layer.

Figure 2B:
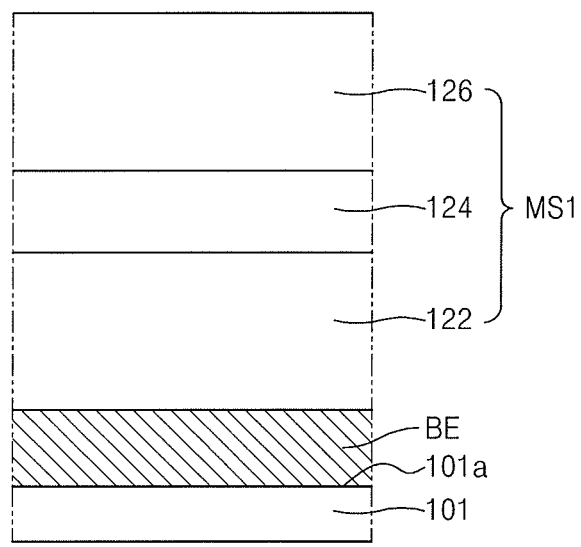
FIG. 2B illustrates a view of a lower magnetic structure including a pinned layer according to an embodiment.

FIG. 2B illustrates a view of the lower magnetic structure MS1 including the pinned layer, according to an embodiment.

Referring to FIG. 2B, the lower magnetic structure MS1 may include a first ferromagnetic layer 122, a first exchange coupling layer 124, and a second ferromagnetic layer 126, which are sequentially stacked. A magnetization direction of the first ferromagnetic layer 122 may be opposite to a magnetization direction of the second ferromagnetic layer 126.

The magnetization directions of the first ferromagnetic layer 122 and second ferromagnetic layer 126 may be substantially perpendicular to an upper surface 101a of a substrate 101. For example, the magnetization directions of the first and second ferromagnetic layers 122 and 126 may be substantially perpendicular to an upper surface of the lower magnetic structure MS1. The first and second ferromagnetic layers 122 and 126 may each include a perpendicular magnetic material (e.g., CoFeTb, CoFeGd, CoFeDy), a hexagonal close packed lattice structure. According to an embodiment, the perpendicular magnetic material having the $L1_0$ structure may include at least one of FePt having the $L1_0$ structure, FePd having the $L1_0$ structure, CoPd having the $L1_0$ structure, and CoPt having the $L1_0$ structure. The first exchange coupling layer 124 may include at least one material selected from nonmagnetic metal elements including a nonmagnetic transition metal. In an implementation, the first exchange coupling layer 124 may include, e.g., magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobium (Nb), zirconium (Zr), yttrium (Y), or hafnium (Hf).

Figure 2C:
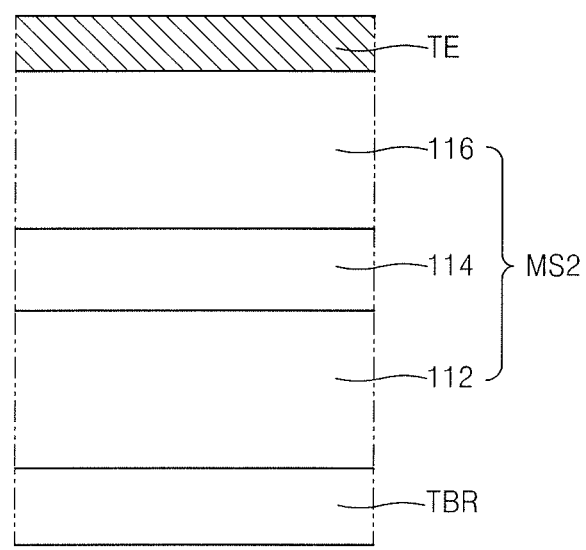
FIG. 2C illustrates a view of an upper magnetic structure including a free layer according to an embodiment.

FIG. 2C illustrates a view of the upper magnetic structure MS2 including the free layer according to an embodiment.

Referring to FIG. 2C, the upper magnetic structure MS2 may include a free layer 112 between the tunnel barrier TBR and the upper electrode TE, a second exchange coupling layer 114 between the free layer 112 and the upper electrode TE, and an auxiliary layer 116 between the second exchange coupling layer 114 and the upper electrode TE.

The free layer 112 may include a magnetic material. The free layer 112 may have a perpendicular magnetization characteristic. A magnetization direction of the free layer 112 may be parallel to a direction perpendicular to a surface of the free layer 112. In an implementation, the free layer 112 may include, e.g., at least one of Co, Fe, and Ni; one of B, P, As, and Bi; and one of Pt, Ta, Ru, and Pd.

The magnetization direction of the free layer 112 may not be fixed. The magnetization direction of the free layer 112 may change according to a magnetic field formed between the lower electrode BE and the upper electrode TE.

The auxiliary layer 116 may include at least one of a conductive metal oxide and a metal. The auxiliary layer 116 may have a crystalline structure having a similar lattice arrangement as a crystalline structure of the second exchange coupling layer 114. In an implementation, the auxiliary layer 116 may include a material having at least one of a Perovskite structure, a cubic structure, and a tetragonal structure. In an implementation, the auxiliary layer 116 may include at least one of a conductive metal oxide having the Perovskite structure (e.g., $SrRuO_3$), a metal having a face centered cubic (FCC) structure (e.g., Pt), and a metal having a body centered cubic (BCC) structure (for example, W). The auxiliary layer 116 may promote growth of and may maintain the crystalline structure of the second exchange coupling layer 114.

The second exchange coupling layer 114 may have a single layer or multilayer structure including a multiferroic material having ferroelectric and anti-ferromagnetic characteristics. In an implementation, the second exchange coupling layer 114 may include an oxide multiferroic material having a Perovskite structure. For example, the second exchange coupling layer 114 may include $BiFeO_3$, $YMnO_3$, or the like. A bottom (e.g., substrate-facing) surface of the second exchange coupling layer 114 may contact a top (e.g., upper electrode-facing) surface of the free layer 112, and a top surface of the second exchange coupling layer 114 may contact a bottom surface of the auxiliary layer 116.

The tunnel barrier TBR may include at least one of oxides of Mg, Ti, Al, MgZn, and MgB, and nitrides of Ti and V. In an implementation, the tunnel barrier TBR may be a MgO film. In an implementation, the tunnel barrier TBR may include a plurality of layers.

The lower electrode BE may include at least one of a conductive metal nitride and a metal. In an implementation, the lower electrode BE may perform functions as a seed of the lower magnetic structure MS1. In an implementation, when the lower magnetic structure MS1 is formed of a perpendicular magnetic material having the $L1_0$ structure, the lower electrode BE may include a conductive metal nitride having a sodium chloride (NaCl) crystalline structure (e.g., TiN, TaN, CrN, or VN). In an implementation, when the lower magnetic structure MS1 has a close-packed hexagonal crystalline structure, the lower electrode BE may include a conductive material having the close-packed hexagonal crystalline structure, e.g., ruthenium. In an implementation, the lower electrode BE may include another conductive material, e.g., Ti or Ta.

In an implementation, the upper electrode TE may include a metal, e.g., Ta, Al, Cu, Au, Ag, or Ti, or a conductive metal nitride, e.g., TiN, TaN, or WN.

The lower electrode BE may be electrically connected to the select element SE through a contact plug CP1. The contact plug CP1 may be formed in an interlayer insulating layer ILD1, and may include at least one of a dopant-doped semiconductor material (e.g., doped silicon), a metal (e.g., W, Al, Ti, or Ta), a conductive metal nitride (e.g., TiN, TaN, or WN), and a metal-semiconductor compound (e.g., metal silicide).

Various semiconductor elements used by the control logic 50 may be provided in the second region. One of the various semiconductor elements used by the control logic 50 may be referred to as a logic device. In addition a first horizontal line wire ME1 electrically connected to the various elements may be provided in the second region. The first horizontal line wire ME1 may be electrically connected to a first via plug VP1. In an implementation, the first horizontal line wire ME1 may be electrically connected to the first via plug VP1 through a second via plug VP2. In an implementation, the first horizontal line wire ME1 may directly contact and be electrically connected to the first via plug VP1.

The first via plug VP1 of the second region may be formed of substantially the same material as the lower magnetic structure MS1 of the first region. Since a material of the lower magnetic structure MS1 has been described above, descriptions about a material of the first via plug VP1 will not be provided again. In the present specification, when two elements are formed of "substantially the same material", the elements may include the same material except for a small difference generated when an unintended impurity is introduced in the materials during the manufacture thereof.

In an implementation, the second via plug VP2 may be formed of a material that is different from the first via plug VP1. In an implementation, the second via plug VP2 may be formed of, e.g., Cu. In an implementation, a barrier layer for preventing diffusion of Cu may be disposed at an interface between the second via plug VP2 and an interlayer insulating layer ILD2, and may include a metal nitride. e.g. TiN or TaN, or a metal having excellent chemical stability, e.g. rubidium (Rb) or Co.

The first horizontal line wire ME1 may be formed of the same material as the second via plug VP2. In an implementation, there may be no interface between the first horizontal line wire ME1 and the second via plug VP2. In an implementation, the first horizontal line wire ME1 may be formed of, e.g., Cu. In an implementation, a barrier layer for preventing diffusion of Cu may be disposed on an interface between the first horizontal line wire ME1 and the interlayer insulating layer ILD2, and may include a metal nitride, such as TiN or TaN, or a meta having excellent chemical stability, such as Rb or Co.

In an implementation, a lower (e.g., substrate-facing) surface LS1 of the lower magnetic structure MS1 of the first region may be located substantially on the same plane as (e.g., substantially coplanar with) a lower surface LS2 of the first via plug VP1 of the second region. When two surfaces are "located substantially on the same plane" or "coplanar", a level difference between the two surfaces is within a range that may be generated when either one of the surfaces is manufactured. In an implementation, the level difference may be from about 0 nm to about 10 nm.

In an implementation, an upper (e.g., upper electrode-facing) surface US1 of the lower magnetic structure MS1 of the first region may be located substantially on the same plane as or coplanar with an upper surface US2 of the first via plug VP1 of the second region.

In an implementation, a height H1 of the lower magnetic structure MS1 (e.g., as measured from the lower electrode BE) of the first region may be substantially the same as a height H2 of the first via plug VP1 (e.g., as measured from a first conductor layer CON1) of the second region. In an implementation, when heights of two structures are "substantially the same", the heights of the two structures have a difference within a range from about 0 nm to about 10 nm.

In an implementation, the height H1 of the lower magnetic structure MS1 of the first region and the height 142 of the first via plug VP1 of the second region being substantially the same may not necessarily mean that the lower surface LS1 of the lower magnetic structure MS1 and the lower surface LS2 of the first via plug VP1 are on the same plane. In an implementation, the height H1 of the lower magnetic structure MS1 of the first region and the height H2 of the first via plug VP1 of the second region being substantially the same may not necessarily mean that the upper surface US1 of the lower magnetic structure MS1 and the upper surface US2 of the first via plug VP1 are on the same plane.

In an implementation, when the height H1 of the lower magnetic structure MS1 of the first region and the height H2 of the first via plug VP1 of the second region are substantially the same and the lower surface LS1 of the lower magnetic structure MS1 and the lower surface LS2 of the first via plug VP1 are on the same plane, the upper surface US1 of the lower magnetic surface MS1 and the upper surface US2 of the first via plug VP1 may be located substantially on the same plane.

In an implementation, when the height H1 of the lower magnetic structure MS1 of the first region and the height H2 of the first via plug VP1 of the second region are substantially the same and the upper surface US1 of the lower magnetic structure MS1 and the upper surface US2 of the first via plug VP1 are on the same plane, the lower surface LS1 of the lower magnetic surface MS1 and the lower surface LS2 of the first via plug VP1 may be located substantially on the same plane.

In an implementation, the same material as the upper magnetic structure MS2 may not exist or may not be present over or on the first via plug VP1 in the second region. In an implementation, the same material as the tunnel barrier TBR may not exist or may not be present over or on the first via plug VP1 in the second region.

In an implementation, the second via plug VP2 may exist over or may be on the first via plug VP1 in the second region. In an implementation, the second via plug VP2 may be electrically connected to the first via plug VP1. In an implementation, the second via plug VP2 may directly physically contact the first via plug VP1.

In an implementation, the first via plug VP1 of the second region may have a different diameter from the second via plug VP2. When a diameter of the first via plug VP1 and/or the second via plug VP2 in a horizontal direction changes according to a height in a vertical direction, the first via plug VP1 may have a different diameter from the second via plug VP2 at an interface where the first and second via plugs VP1 and VP2 contact each other.

In an implementation, the first conductor layer CON1 may be provided below the first via plug VP1 in the second region (e.g., may be between the first via plug VP1 and the substrate). The first conductor layer CON1 may be formed of substantially the same material as the lower electrode BE of the first region. Since a material of the lower electrode BE has been described above, descriptions about a material of the first conductor layer CON1 is not provided again.

In an implementation, a height of the first conductor layer CON1 of the second region in a vertical direction (e.g., orthogonal to a surface of the substrate) may be substantially the same as a height of the lower electrode BE of the first region in the vertical direction.

In an implementation, an upper (e.g., first via plug-facing) surface of the first conductor layer CON1 of the second region may be located substantially on the same plane as or coplanar with an upper (e.g., magnetic tunnel junction-facing) surface of the lower electrode BE of the first region.

In an implementation, a lower (e.g., substrate-facing) surface of the first conductor layer CON1 of the second region may be located substantially on the same plane as or coplanar with a lower surface of the lower electrode BE of the first region.

The first conductor layer CON1 may be electrically connected to a semiconductor element (e.g., a logic device) therebelow through a contact plug CP2. The contact plug CP2 may be formed in an interlayer insulating layer ILD1, and may be formed of substantially the same material as the contact plug CP1. Since a material of the contact plug CP1 has been described above, details thereof are not provided again.

The interlayer insulating layer ILD1 may include silicon oxide (SiO) and/or silicon nitride (SiN).

In an implementation, as illustrated in FIG. 2A, side surfaces of the lower electrode BE, lower magnetic structure MS1, tunnel barrier TBR, upper magnetic structure MS2, and upper electrode TE of the memory element ME may be self-aligned. In an implementation, at least one of the side surfaces may not be aligned with the remaining side surfaces.

A side surface of the memory element ME in the first region may be coated with a first spacer SP1 (e.g., may include the first spacer SP1 thereon). In an implementation, the first spacer SP1 may include, e.g., SiN, SiO and/or silicon oxynitride (SiON).

In the second region, a side surface of the first via plug VP1 may be coated by a second spacer SP2 (e.g., may include the second spacer SP2 thereon). In an implementation, the second spacer SP2 may include, e.g., SiN, SiO and/or SiON.

In an implementation, the first spacer SP1 may be formed of substantially the same material as the second spacer SP2. In an implementation, a bottom width W1 of the first spacer SP1 may be substantially the same as a bottom width W2 of the second spacer SP2. In an implementation, when two widths are "substantially the same" means that the widths have a difference therebetween within a range from about 0 nm to about 5 nm.

The upper electrode TE may be electrically connected to a second horizontal line wire ME2 through a third via plug VP3. In an implementation, the third via plug VP3 may be formed of, e.g., Cu. A barrier layer for preventing diffusion of Cu may be disposed on or at an interface between the third via plug VP3 and the interlayer insulating layer ILD2, and since descriptions about the barrier layer are same as those described above with reference to the second via plug VP2, details thereof are not provided again.

The second horizontal line wire ME2 may be formed of the same material as the third via plug VP3. In an implementation, there may be no interface between the second horizontal line wire ME2 and the third via plug VP3. In an implementation, the second horizontal line wire ME2 may be formed of, e.g., Cu. A barrier layer for preventing diffusion of Cu may be disposed on or at an interface between the second horizontal line wire ME2 and the interlayer insulating layer ILD2, and since descriptions about the barrier layer are same as those described above with reference to the first horizontal line wire ME1, details thereof are not provided again.

In an implementation, the first horizontal line wire ME1 and the second horizontal line wire ME2 may be wires located substantially on the same level. In an implementation, the first horizontal line wire ME1 and the second horizontal line wire ME2 may be formed of the same material.

An aspect ratio of the second via plug VP2 (e.g., to be formed later) may be reduced by forming the first via plug VP1 while manufacturing the lower magnetic structure MS1. For example, if the first via plug VP1 were to not be formed while manufacturing the lower magnetic structure MS1, the aspect ratio of the later-formed second via plug VP2 could increase. By reducing the aspect ratio of the second via plug VP2, a via plug may have low resistance and reduced possibility of including a defect, e.g. an internal void. In an implementation, the first via plug VP1 may be formed while manufacturing the lower magnetic structure MS1, and a via plug having an excellent electric characteristic may be obtained without an additional operation.

Figure 3:
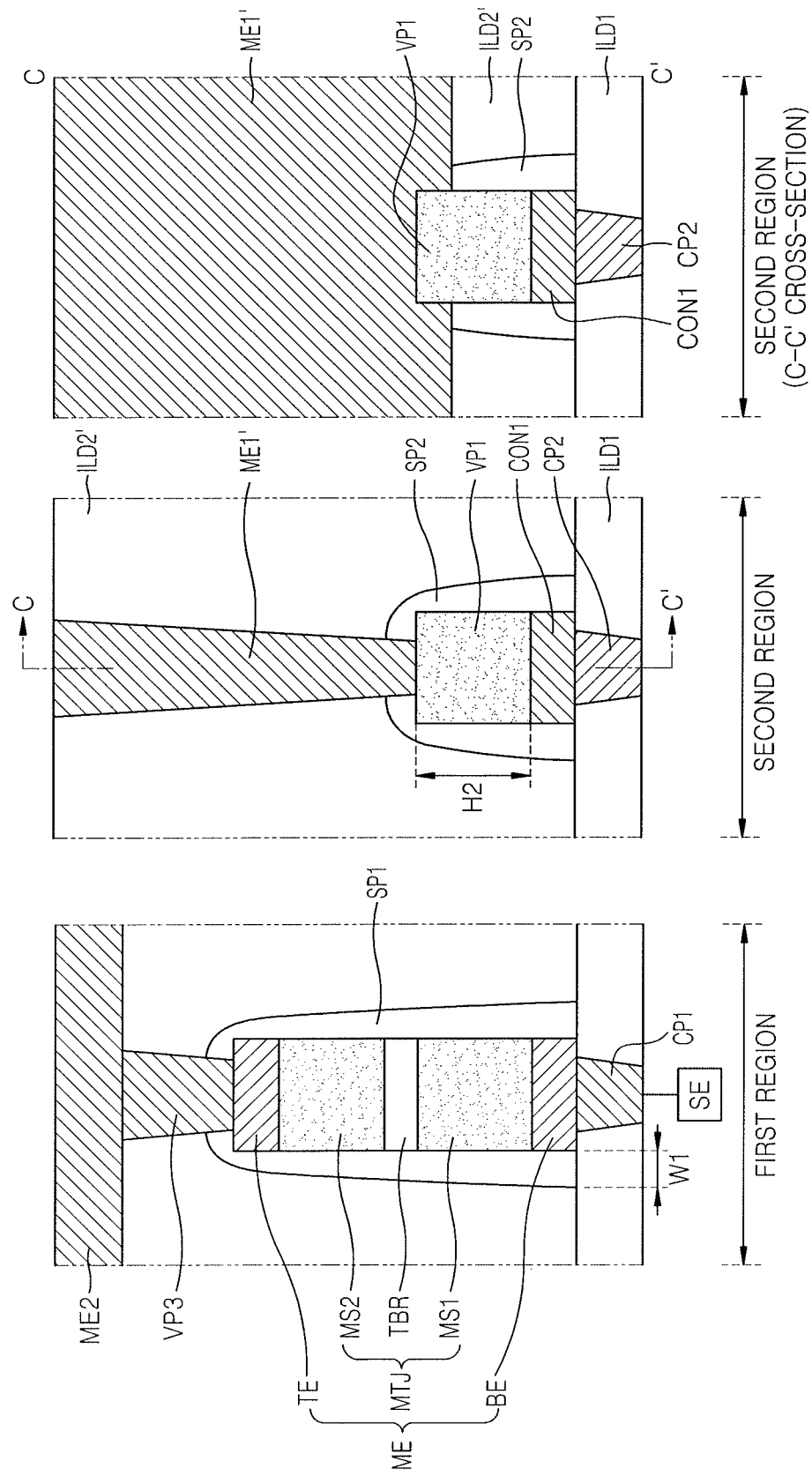
FIG. 3 illustrates a cross-sectional view of portions of a first region and a second region of a semiconductor device, according to another embodiment.

FIG. 3 illustrates a cross-sectional view of portions of a first region and a second region of a semiconductor device, according to another embodiment.

Compared with FIG. 2A, in FIG. 3, the second via plug VP2 may be omitted and a first horizontal line wire ME1' may directly contact the first via plug VP1. Accordingly, details overlapping those of FIG. 2A are not repeated and only differences between FIGS. 2A and 3 will be mainly described.

Referring to FIG. 3, a lower surface of the first horizontal line wire ME1' may extend in one direction while directly contacting an upper surface of the first via plug VP1. Referring to a C-C' cross-section of FIG. 3, the first horizontal line wire ME1' may extend in a left-and-right direction.

As such, when the second via plug VP2 is omitted, the first via plug VP1 may perform the same operations as one complete via plug, and thus, an additional via plug may not be required, thereby being possible to help reduce the costs for manufacturing the semiconductor device.

Figure 4:
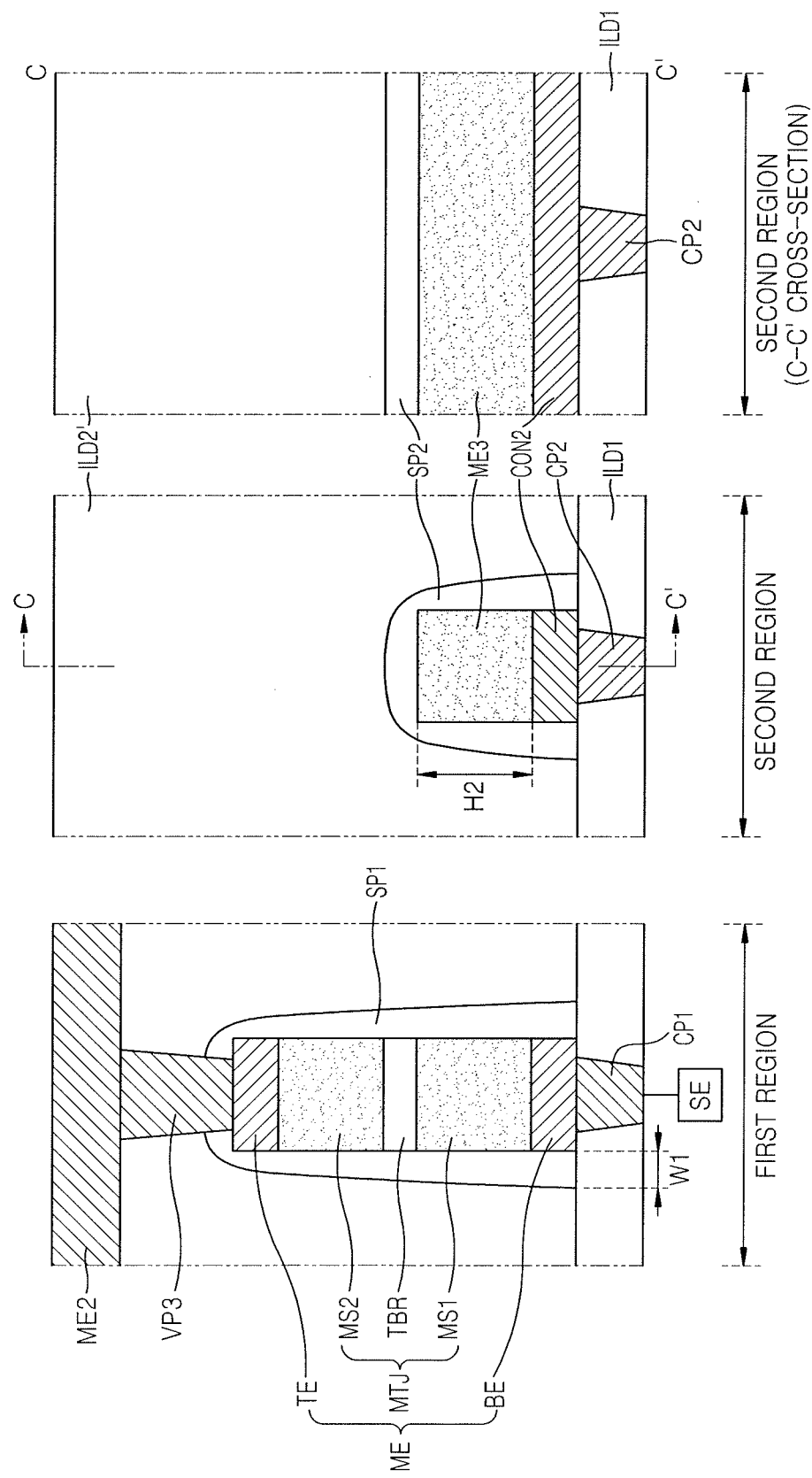
FIG. 4 illustrates a cross-sectional view of portions of a first region and a second region of a semiconductor device, according to another embodiment.

FIG. 4 illustrates a cross-sectional view of portions of a first region and a second region of a semiconductor device, according to another embodiment.

Compared with FIG. 2A, in FIG. 4, the first horizontal line wire ME1 and the second via plug VP2 may be omitted, and a third horizontal line wire ME3 may be provided instead of the first via plug VP1. Accordingly, details overlapping those of FIG. 2A are not repeated and only differences between FIGS. 2A and 4 will be mainly described.

Referring to FIG. 4, the third horizontal line wire ME3 may extend in a viewing direction (a left-and-right direction in a C-C' cross-section). Also, a second conductor layer CON2 may be provided below the third horizontal line wire ME3. In an implementation, sidewalls of the second conductor layer CON2 and third horizontal line wire ME3 may be aligned. In this case, the second conductor layer CON2 may also extend in the viewing direction (the left-and-right direction in the C-C' cross-section).

The third horizontal line wire ME3 may be formed of the same material as the lower magnetic structure MS1 of the first region. In an implementation, the third horizontal line wire ME3 may have substantially the same thickness as the lower magnetic structure MS1. In an implementation, an upper surface of the third horizontal line wire ME3 may be located substantially on the same plane as an upper surface of the lower magnetic structure MS1. In an implementation, a lower surface of the third horizontal line wire ME3 may be locates substantially on the same plane as a lower surface of the lower magnetic structure MS1.

The second conductor layer CON2 may be formed of the same material as the lower electrode BE of the first region. In an implementation, the second conductor layer CON2 may have substantially the same thickness as the lower electrode BE. In an implementation, an upper surface of the second conductor layer CON2 may be located substantially on the same plane as an upper surface of the lower electrode BE. In an implementation, a lower surface of the second conductor layer CON2 may be located substantially on the same plane as a lower surface of the lower electrode BE.

The second conductor layer CON2 may be electrically connected to the contact plug CP2 located therebelow.

FIGS. 5A through 5F illustrate lateral cross-sectional views of stages in a method of manufacturing the semiconductor device 1, according to an embodiment.

Figure 5A:
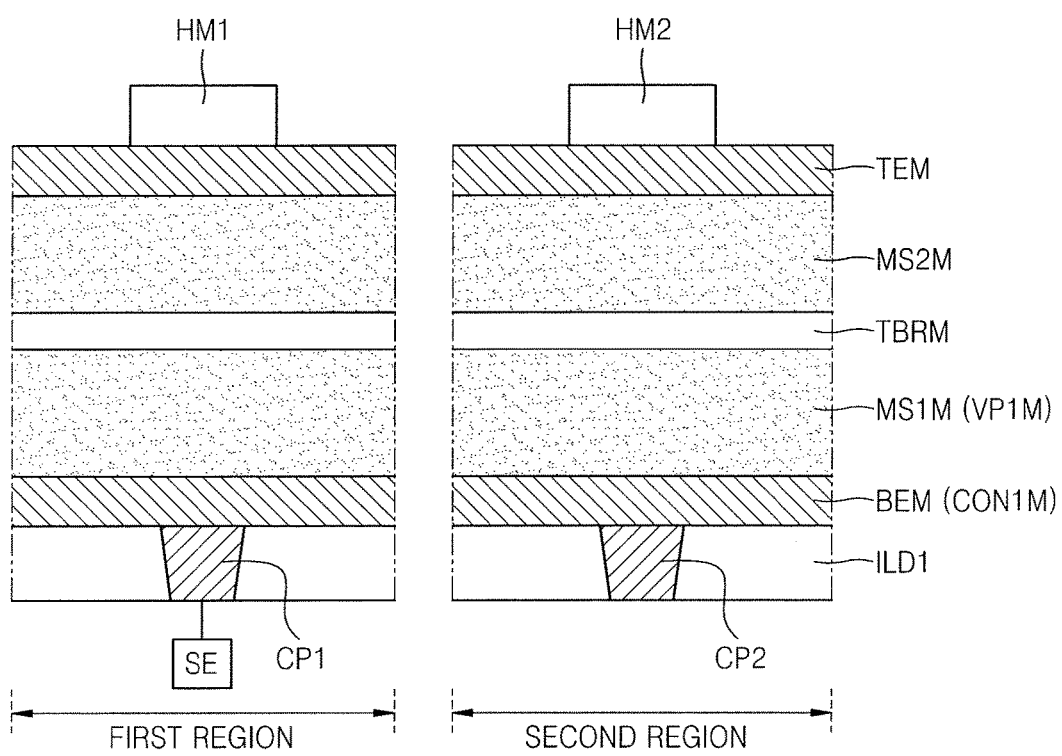
FIGS. 5A through 5F illustrate lateral cross-sectional views of stages in a method of manufacturing a semiconductor device, according to an embodiment.

Referring to FIG. 5A, a semiconductor substrate may have first and second regions, and the select element SE may be provided in the first region.

The semiconductor substrate may be, e.g., a silicon (Si) substrate, a germanium (Ge) substrate, a Si-Ge substrate, a silicon-on-insulator (SOI) substrate, or a germanium-on-insulator (GOI) substrate.

The contact plug CP1 may be provided in the interlayer insulating layer ILD1 in the first region of the first substrate. The contact plug CP1 may be electrically connected to the select element SE. The contact plug CP2 may be provided in the interlayer insulating layer ILD1 in the second region of the semiconductor substrate.

Then, a lower electrode material film BEM, a lower magnetic material film MS1M, a tunnel barrier material film TBRM, an upper magnetic material film MS2M, and an upper electrode material film TEM may be sequentially stacked to be electrically connected to the contact plugs CP1 and CP2. Since a type of each material film has been described above with reference to FIG. 2A, details thereof are not provided again.

The lower magnetic material film MS1M of the second region may also be referred to as a first via plug material film VP1M, and the lower electrode material film BEM of the second region may also be referred to as a first conductor material film CON1M.

In an implementation, each of the material films may be formed by using, e.g., a chemical vapor deposition (CVD) method, a physical vapor deposition (PVD) method, and/or an atomic layer deposition (ALD) method.

Mask patterns HM1 and HM2 corresponding to patterns of the memory element ME (described below) and the first via plug VP1 may be formed. The mask patterns HM1 and HM2 may be formed of a suitable material that has an etch selectivity with the material films. In an implementation, the mask patterns HM1 and HM2 may be photoresist patterns, or may be hard mask patterns, such as SiN or SiON.

Figure 5B:
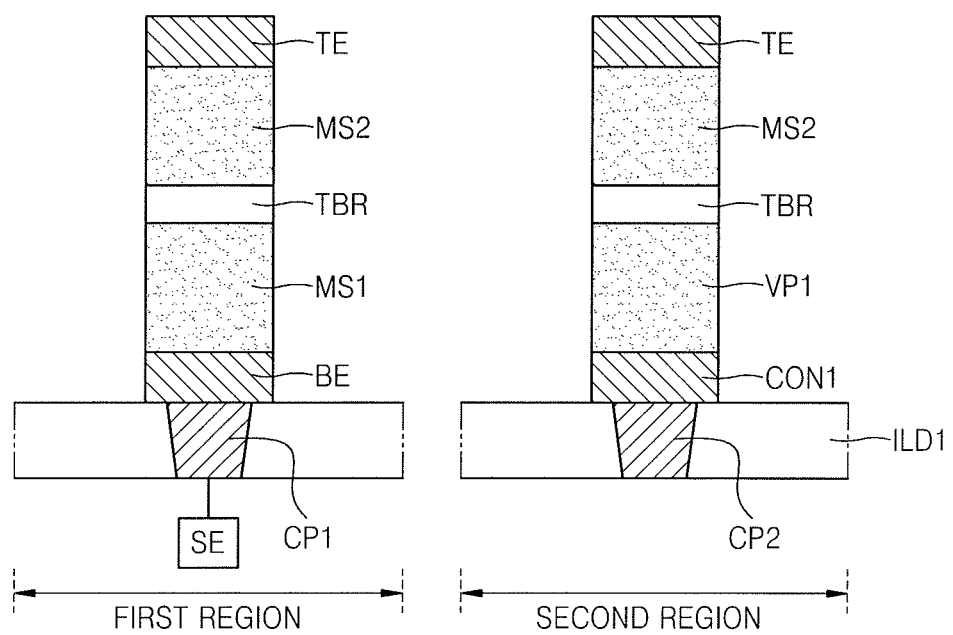

Referring to FIG. 5B, anisotropic etching may be performed by using the mask patterns HM1 and HM2 as etch masks.

The lower electrode BE, the lower magnetic structure MS1, the tunnel barrier TBR, the upper magnetic structure MS2, and the upper electrode TE may be formed via the anisotropic etching in the first region. In an implementation, sidewalls of the lower electrode BE, lower magnetic structure MS1, tunnel barrier TBR, upper magnetic structure MS2, and upper electrode TE may be vertical. In an implementation, widths thereof may gradually increase towards the contact plugs CP1 and CP2.

The first conductor layer CON1, the first via plug VP1, the tunnel barrier TBR, the upper magnetic structure MS2, and the upper electrode TE may be formed via the anisotropic etching in the second region. In an implementation, sidewalls of the first conductor layer CON1, first via plug VP1, tunnel barrier TBR, upper magnetic structure MS2, and upper electrode TE may be vertical. In an implementation, widths thereof may gradually increase towards the contact plugs CP1 and CP2.

Figure 5C:
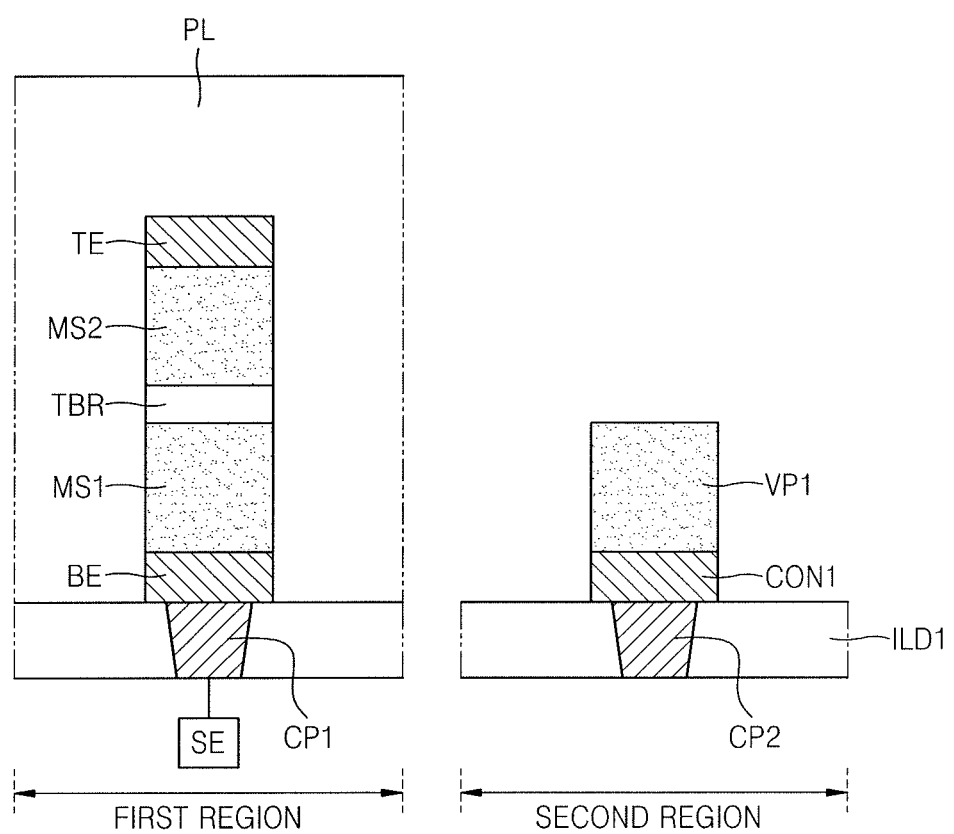

Referring to FIG. 5C, the first region may be protected by a passivation layer, and then the tunnel barrier TBR, the upper magnetic structure MS2, and the upper electrode TE may be removed from the second region.

The tunnel barrier TBR, the upper magnetic structure MS2, and the upper electrode TE of the second region may be removed selectively from those of the first region. Accordingly, the passivation layer PL covering the tunnel barrier TBR, the upper magnetic structure MS2, and the upper electrode TE may be formed in the first region. The passivation layer PL may be formed such that the tunnel barrier TBR, the upper magnetic structure MS2, and the upper electrode TE of the second region are exposed.

In an implementation, the passivation layer PL may be a suitable material having etch resistance with respect to an etchant removing the tunnel barrier TBR, the upper magnetic structure MS2, and the upper electrode TE of the second region, and, e.g., may be a SiO film, a SiN film, or a SiON film.

Then, the tunnel barrier TBR, the upper magnetic structure MS2, and the upper electrode TE may be selectively removed. Accordingly, suitable anisotropic etching and/or isotropic etching may be performed. For example, when MgO is used as the tunnel barrier TBR, the tunnel barrier TBR may be easily removed by using water. For example, the tunnel barrier TBR may be removed by using water, and the upper magnetic structure MS2 and the upper electrode TE, which are on the tunnel barrier TBR (e.g., isolated by the tunnel barrier TBR) may be removed together with the tunnel barrier TBR via lift-off.

In an implementation, a polar solvent having 1 to 5 carbon atoms, e.g., a C1 to C5 monovalent alcohol or polyalcohol, may be used as an etchant for removing MgO, in addition to water. In an implementation, a mixture of water and C1 to C5 monovalent alcohol or polyalcohol may be used as the etchant.

The lower magnetic structure MS1 and the first via plug VP1 may originate from the same material film, i.e., the lower magnetic material film MS1M, and a height of the lower magnetic structure MS1 and a height of the first via plug VP1 may be substantially the same. In an implementation, an upper surface of the lower magnetic structure MS1 and an upper surface of the first via plug VP1 may be located on the same plane. In an implementation, a lower surface of the lower magnetic structure MS1 and a lower surface of the first via plug VP1 may be located on the same plane.

Figure 5D:
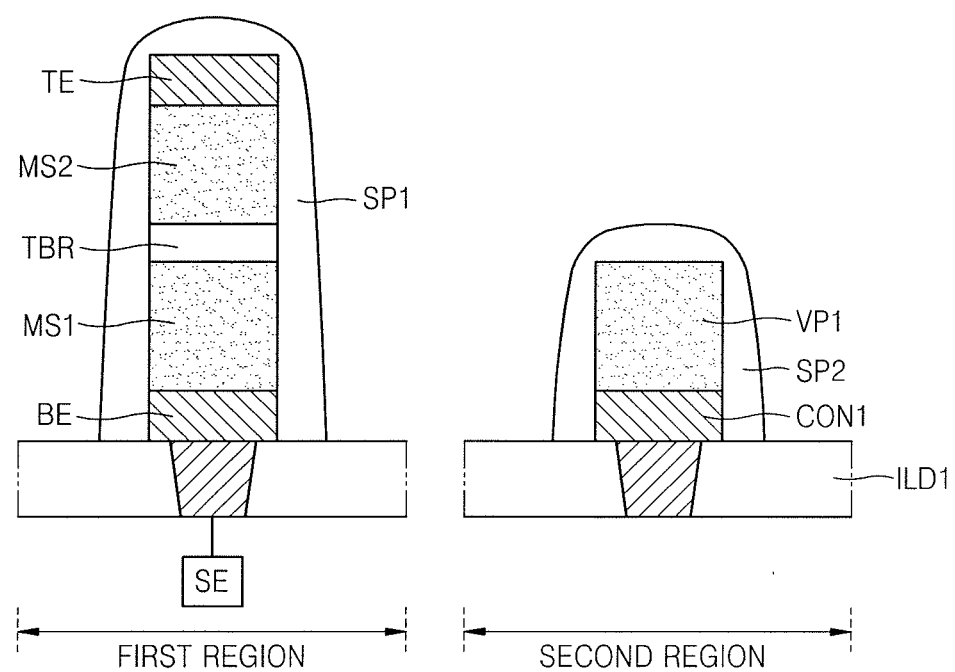

Referring to FIG. 5D, the first spacer SP1 may be formed on side surfaces of the lower electrode BE, lower magnetic structure MS1, tunnel barrier TBR, upper magnetic structure MS2, and upper electrode TE of the first region. In an implementation, the second spacer SP2 may be formed on side surfaces of the first conductor layer CON1 and first via plug VP1 of the second region.

The first spacer SP1 and the second spacer SP2 may be simultaneously formed. For example, the first and second spacers SP1 and SP2 may be formed by performing anisotropic etching after forming spacer material films on upper surfaces and side surfaces of structures in the first and second regions, and over an upper surface of the interlayer insulating layer ILD1.

In an implementation, the spacer material film may be formed of, e.g., SiN, SiO, or SiON.

Figure 5E:
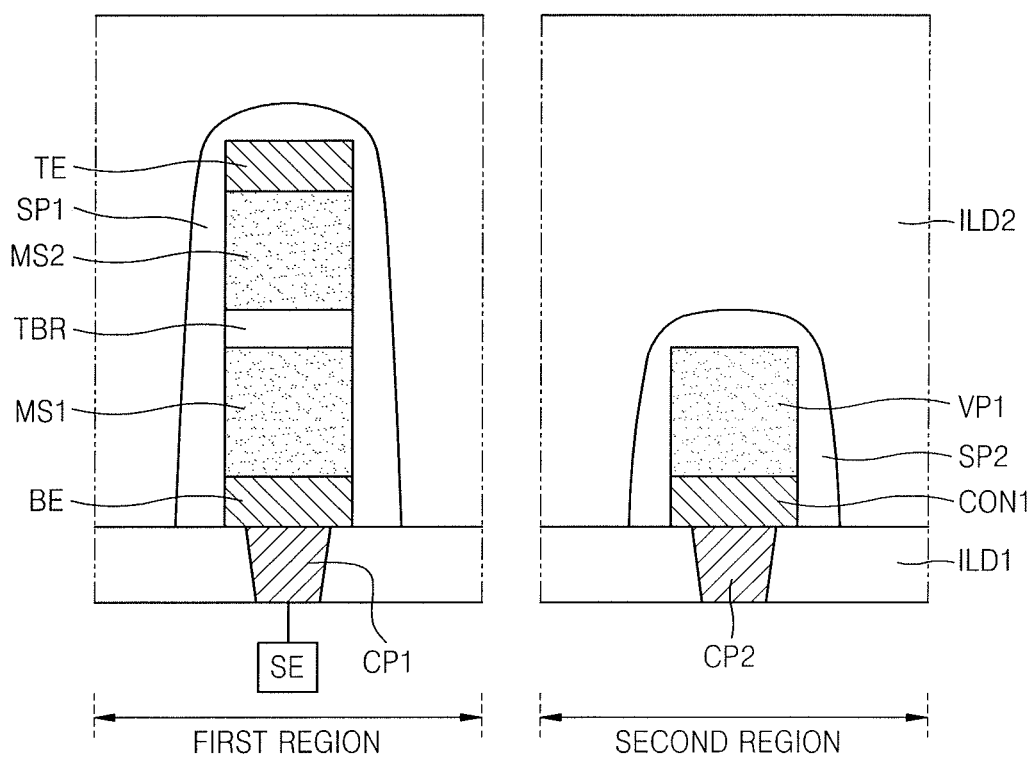

Referring to FIG. 5E, the interlayer insulating layer ILD2 may be formed throughout the first and second regions. The interlayer insulating layer ILD2 may be formed of a material having an etch selectivity with respect the first and second spacers SP1 and SP2. In an implementation, the interlayer insulating layer ILD2 may be formed of, e.g., SiN, SiO, or SiON.

Figure 5F:
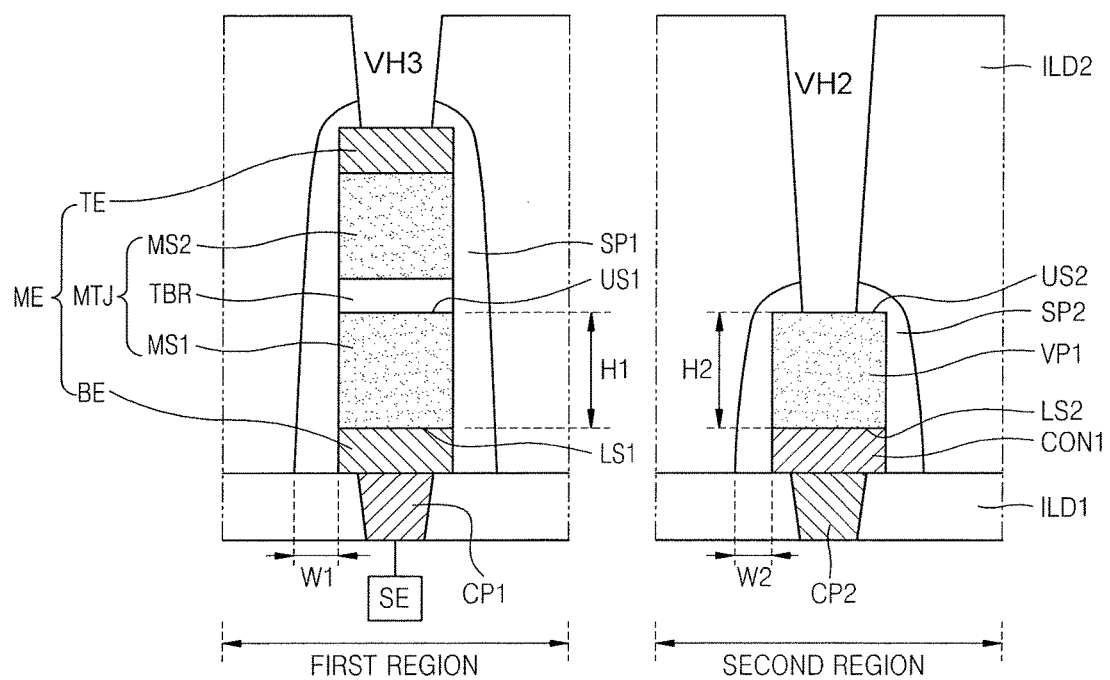

Referring to FIG. 5F, a via hole VH2 for forming the second via plug VP2 and a via hole VH3 for forming the third via plug VP3 may be formed. The via holes VH2 and VH3 may be formed by using a photoresist method.

As described above, the interlayer insulating layer ILD2 may have etch selectivity with the first and second spacers SP1 and SP2, and the first spacer SP1 may prevent the upper electrode TE from being damaged while the second spacer SP2 is exposed by the via hole VH2. In an implementation, portions of the first and second spacers SP1 and SP2 exposed by the via holes VH2 and VH3 may be removed to expose a portion of the upper electrode TE and the first via plug VP1.

Next, the second and third via plugs VP2 and VP3 and the first and second horizontal line wires ME1 and ME2 may be formed in the via holes VH2 and VH3 to obtain the semiconductor device of FIG. 2A. The second and third via plugs VP2 and VP3 and the first and second horizontal line wires ME1 and ME2 may be simultaneously formed or sequentially formed. According to some embodiments, the second and third via plugs VP2 and VP3 and the first and second horizontal line wires ME1 and ME2 may be formed by using a dual damascene method (refer to FIG. 2A).

Figure 6:
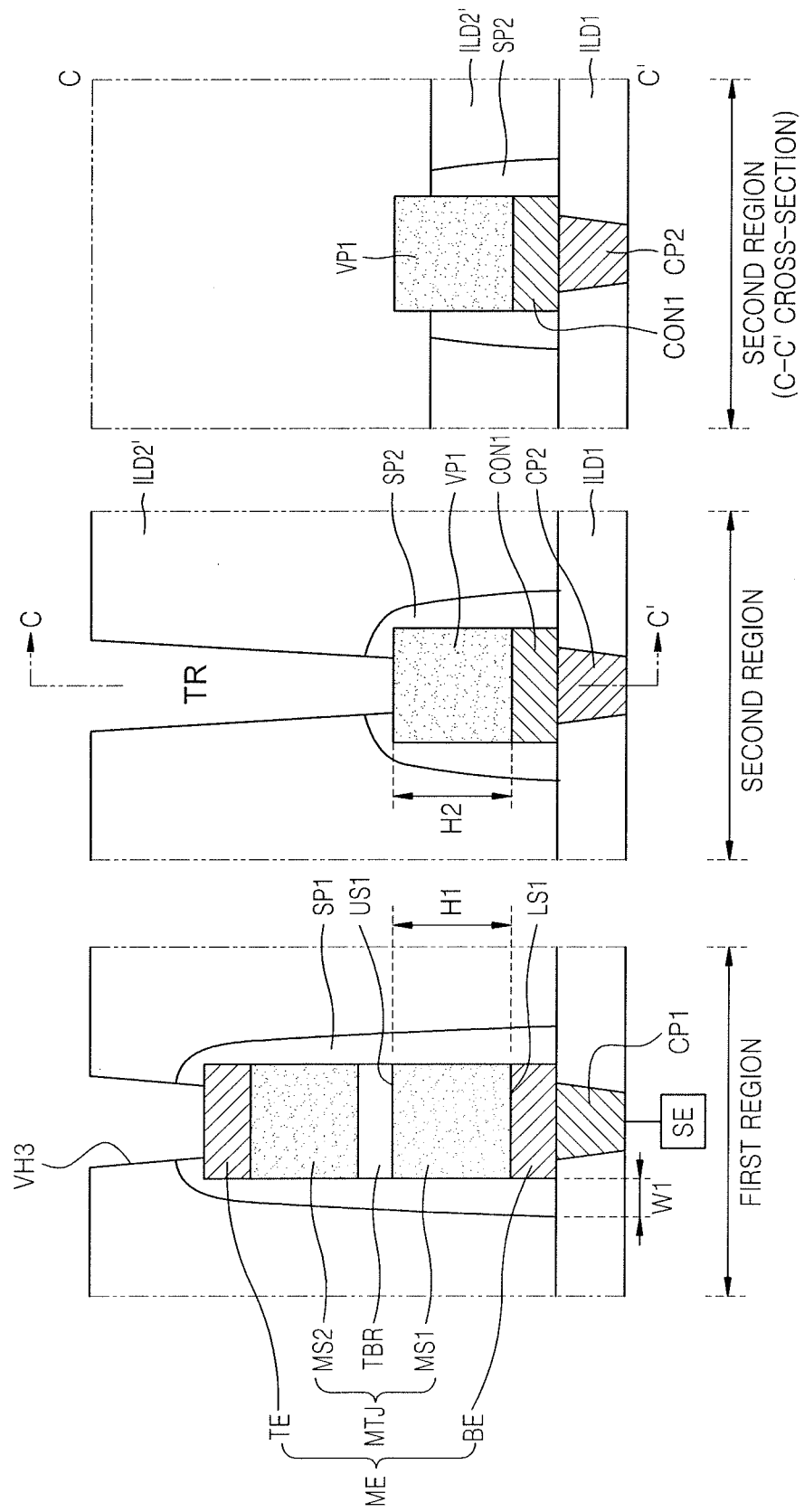
FIG. 6 illustrates a lateral cross-sectional view of a stage in a method of manufacturing a semiconductor device, according to another embodiment.

FIG. 6 illustrates a lateral cross-sectional view of a stage in a method of manufacturing a semiconductor device, according to another embodiment.

The method of FIG. 6 has the same operations as those shown in FIGS. 5A through 5E and other operations. Accordingly, descriptions of the operations of FIGS. 5A through 5E are not provided again. After the operation of FIG. 5E, the via hole VH3 may be formed in the first region. The upper electrode TE may be exposed by the via hole VH3.

In an implementation, a trench TR may be formed in the second region. An upper surface of the first via plug VP1 may be exposed by the trench TR. As shown in a C-C' cross-section of the second region, an upper part of a side surface of the first via plug VP1 may also be exposed by the trench TR. In an implementation, as illustrated in FIG. 6, an upper surface of the second spacer SP2 and an upper surface of an interlayer insulating layer ILD2' may form the same plane. In an implementation, the surfaces may form different planes according to etching characteristics.

Then, inner regions of the via hole VH3 and trench TR may be filled by a conductor. The inner regions of the via hole VH3 and trench TR may be filled simultaneously or at different points of time. When the inner regions of the via hole VH3 and trench TR are filled with Cu, a barrier layer for preventing diffusion of Cu may be formed. The barrier layer may include a metal nitride, such as TiN or TaN, or a metal having excellent chemical stability, such as Rb or Co (refer to FIG. 3).

Figure 7A:
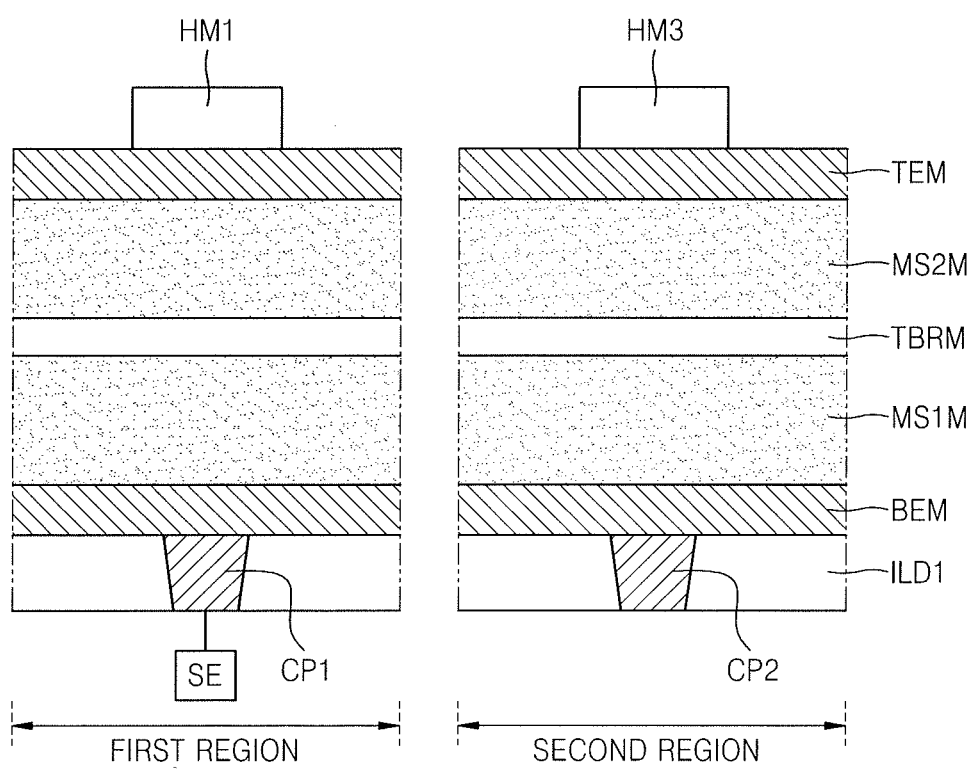
FIGS. 7A and 7B illustrate lateral cross-sectional views of stages in a method of manufacturing a semiconductor device, according to another embodiment.
Figure 7B:
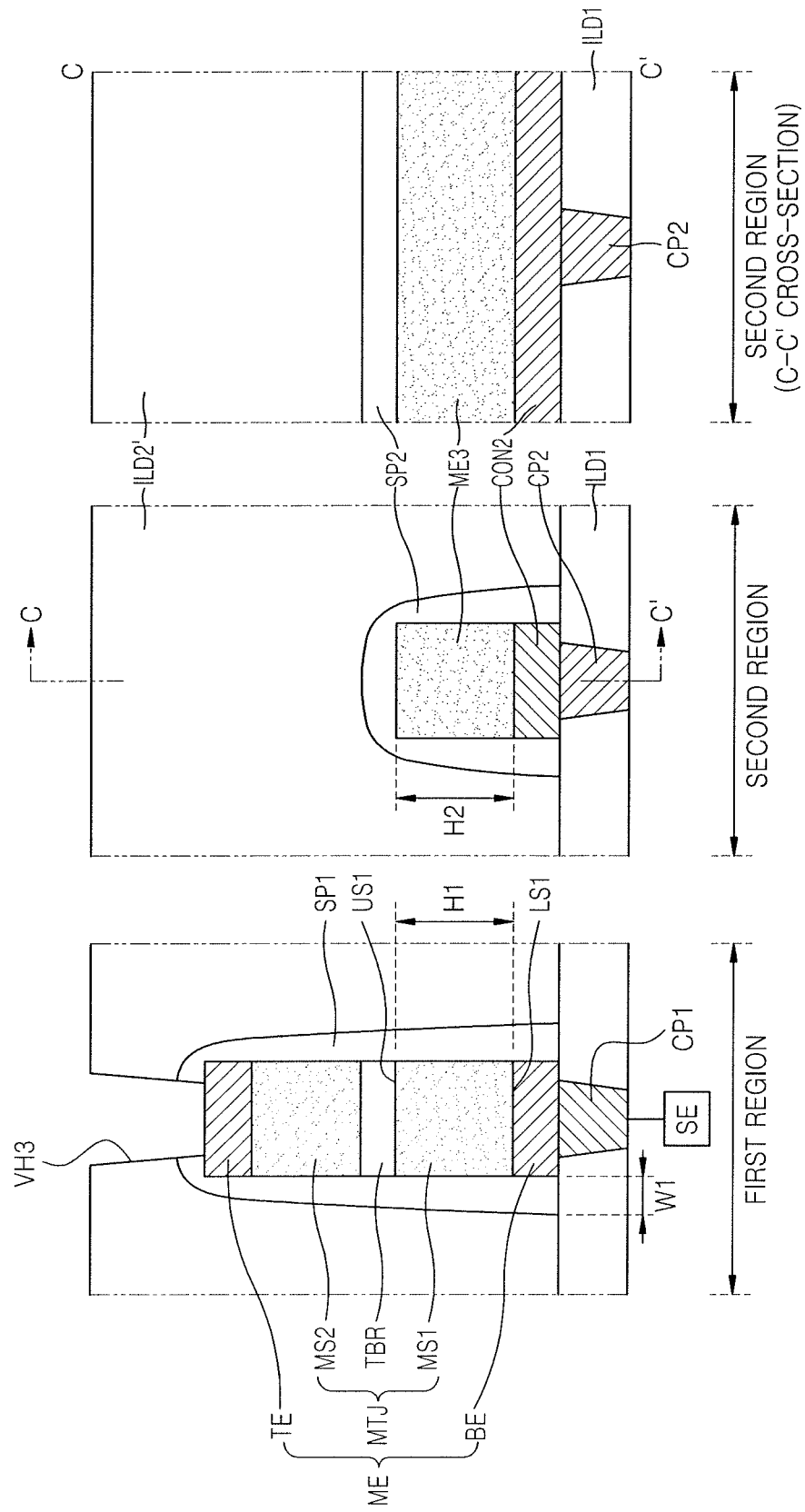

FIGS. 7A and 7B illustrate lateral cross-sectional views of stages in a method of manufacturing a semiconductor device, according to another embodiment.

The method of FIG. 7A is the same as that of FIG. 5A except that a mask pattern HM3 corresponding to the third horizontal line wire ME3 described with reference to FIG. 4 is provided instead of the mask pattern HM2 corresponding to the pattern of the first via plug VP1 of the second region.

According to an embodiment, the mask pattern HM3 may be a wire having a line shape extending in a viewing direction of FIG. 7A.

Since operations 5B through 5E are the same, details thereof are not provided again. The third horizontal line wire ME3 may be provided instead of the first via plug VP1 extending in a vertical direction like a cylinder, and the second conductor layer CON2 may be provided below the third horizontal line wire ME3. The third horizontal line wire ME3 and the second conductor layer CON2 may extend in a line shape in a viewing direction of FIG. 7B (a left-and-right direction in a C-C' cross-section).

Referring to FIG. 7B, the via hole VH3 for forming the third via plug VP3 may be formed in the first region. In an implementation, the via hole VH3 may be formed by using a photoresist method. In an implementation, a via hole exposing an upper surface of the third horizontal line wire ME3 may not be formed.

Then, the third via plug VP3 (refer to FIG. 4) may be formed in the via hole VH3. In an implementation, the second horizontal line wire ME2 may be formed over the third via plug VP3. Since the third via plug VP3 and the second horizontal line wire ME2 have been described above with reference to FIGS. 2A and 4, details thereof are not provided again.

Figure 8:
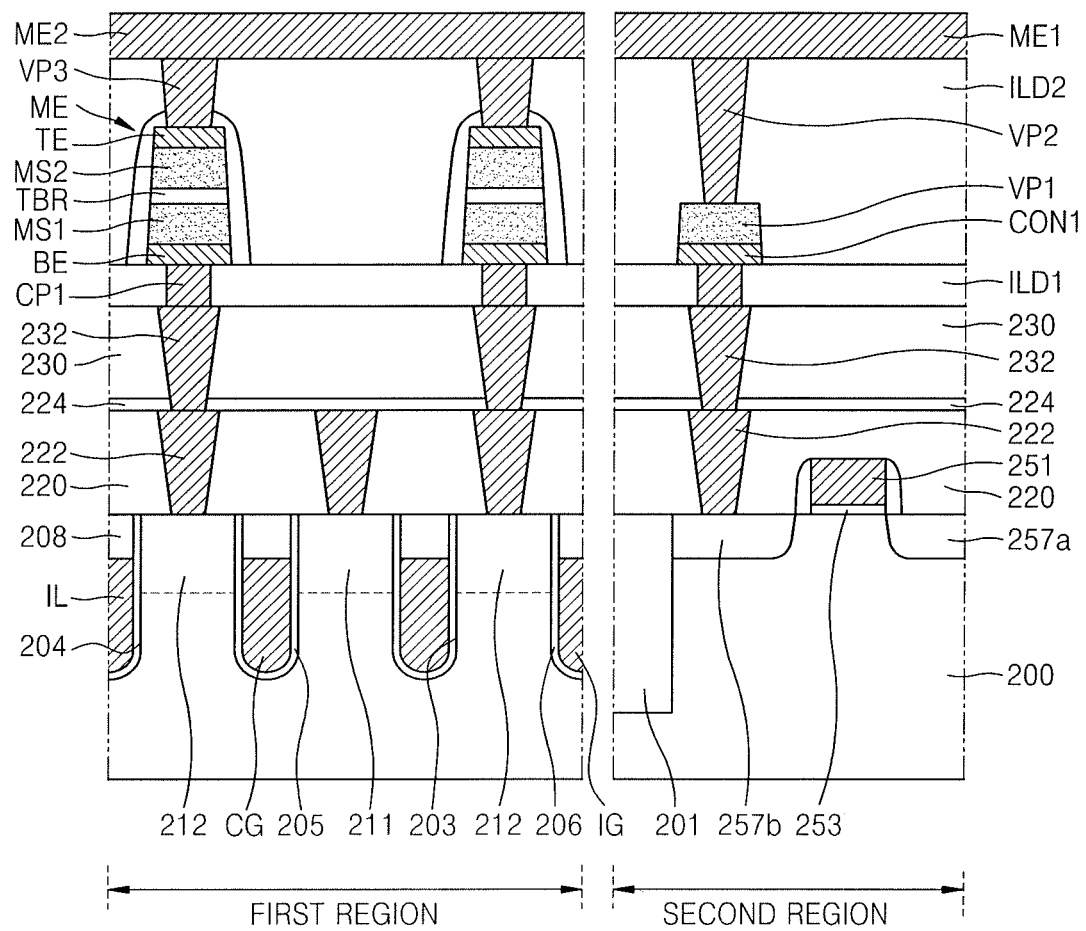
FIG. 8 illustrates a lateral cross-sectional view of a semiconductor device according to an embodiment.

FIG. 8 illustrates a lateral cross-sectional view of a semiconductor device according to an embodiment.

Referring to FIG. 8, a substrate 200 may include a first region and a second region. In an implementation, the first region may be a memory region and the second region may be a peripheral circuit region. In an implementation, the first region may be a magnetic random access memory (MRAM) region and the second region may be a logic circuit region.

The substrate 200 may be a Si substrate, a Ge substrate, or a Si—Ge substrate. The substrate 200 may have first conductivity. Element separating patterns 201 may be formed on the substrate 200. The element separating patterns 201 may include an insulator, such as SiO.

An isolating recess 204 and a gate recess 203 may extend in the first region, and an isolating line IL and a word line CG may extend therein. An isolating gate dielectric layer 206 and a cell gate dielectric layer 205 may be respectively provided between the isolating recess 204 and the isolating line IL and between the gate recess 203 and the word line CG.

The isolating gate dielectric layer 206 and the cell gate dielectric layer 205 may include, for example, SiO, SiN, SiON, and/or a high dielectric material (for example, an insulating metal oxide, such as HfO or AlO). The isolating line IL and the word line CG may include at least one of a dopant-doped semiconductor material (e.g., doped-Si), a metal (e.g., W, Al, Ti, or Ta), a conductive metal nitride (e.g., TiN, TaN, or WN), and a metal-semiconductor compound (e.g., metal silicide).

A gate mask pattern 208 may be provided over the isolating line IL and the word line CG, and the gate mask pattern 208 may include, e.g., SiO, SiN, and/or SiON.

First doping regions 211 may be provided between the word lines CG, and second doping regions 212 may be provided between the word line CG and the isolating line IL. The first and second doping regions 211 and 212 correspond to source/drain regions of a cell transistor. The first and second doping regions 211 and 212 may be doped with a dopant having a second conductivity different from the first conductivity. In an implementation, one of the first and second conductivities may be of an n-type and the other one may be of a p-type.

A first interlayer insulating layer 220 may be provided over the substrate 200, in the first region. The first interlayer insulating layer 220 may include, e.g., SiO. An etch stop layer 224 may be provided above or on the first interlayer insulating layer 220. The etch stop layer 224 may include, e.g., SiN or SiON.

Contact plugs 222 may be formed in the first interlayer insulating layer 220. The contact plugs 222 may include at least one of a dopant-doped semiconductor material (e.g., doped silicon), a metal (e.g., W, Al, Ti, or Ta), a conductive metal nitride (e.g., TiN, TaN, or WN), and a metal-semiconductor compound (e.g., metal silicide).

A transistor having a gate electrode 251 and impurity regions 257a and 257b on both sides of the gate electrode 251 may be provided over or on a gate insulating layer 253 in the second region. In an implementation, the transistor may be a field-effect transistor or a fin field effect transistor (FinFET).

A second interlayer insulating layer 230 and contact plugs 232 provided in the second interlayer insulating layer 230 may be provided over the etch stop layer 224 in the first region. The second interlayer insulating layer 230 may include the same material as the first interlayer insulating layer 2220. The contact plugs 232 may include the same material as the contact plugs 222.

The memory element ME described above with reference to FIG. 2A may be provided on the second interlayer insulating layer 230. For example, the first via plug VP1 may be provided in the second region. As described above with reference to FIG. 2A, the first via plug VP1 of the second region may include substantially the same material and may have the same height as the lower magnetic structure MS1 of the first region.

Since structures including the memory element ME provided on the second interlayer insulating layer 230 have been described above with reference to FIG. 2A, details thereof are not provided again.

Figure 9:
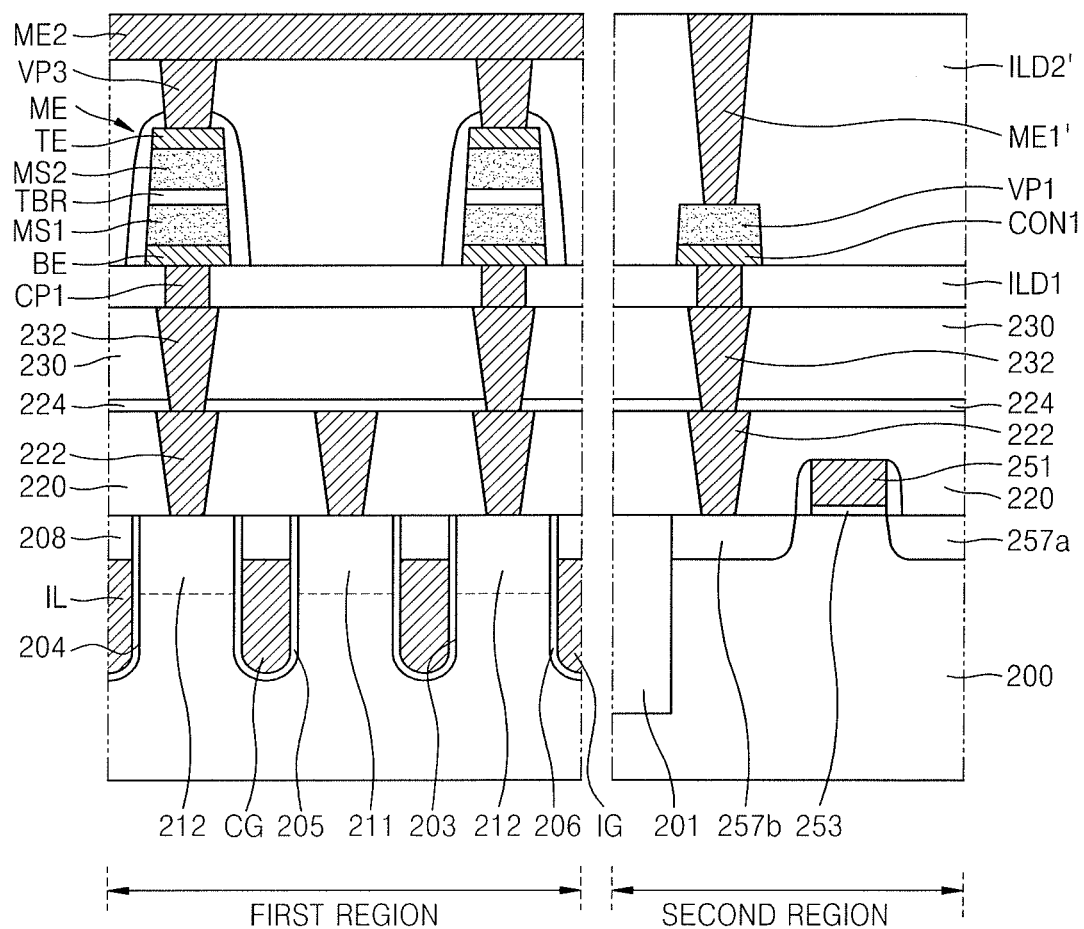
FIG. 9 illustrates a lateral cross-sectional view of a semiconductor device according to another embodiment.

FIG. 9 illustrates a lateral cross-sectional view of a semiconductor device according to another embodiment.

The semiconductor device of FIG. 9 is the same as that of FIG. 8, except that the first via plug VP1 of the second region directly contacts the first horizontal line wire ME1'. Since descriptions thereof have been described above with reference to FIG. 3, details thereof are not provided again.

Referring to FIG. 9, the first horizontal line wire MEP, and the third via plug VP3 and/or the second horizontal line wire ME2 may be formed simultaneously or at different points of time. In an implementation, the third via plug VP3 and the second horizontal line wire ME2 may be formed simultaneously. In an implementation, the third via plug VP3 and the second horizontal line wire ME2 may be formed by using a dual damascene method.

Figure 10:
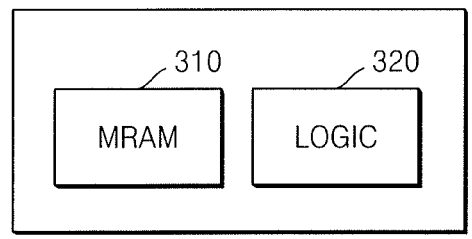
FIG. 10 illustrates a block diagram of a semiconductor device according to an embodiment.

FIG. 10 illustrates a block diagram of a semiconductor device 2 according to an embodiment.

Referring to FIG. 10, the semiconductor device 2 may include an MRAM region 310 and a logic region 320. In an implementation, the MRAM region 310 may correspond to the first region described above with reference to FIGS. 2A through 9 and the logic region 320 may correspond to the second region described above with reference to FIGS. 2A through 9.

In an implementation, a cell array region of the MRAM region 310 may correspond to the first region described above with reference to FIGS. 2A through 9 and a peripheral circuit region with respect to a cell array of the MRAM region 310 may correspond to the second region described above with reference to FIGS. 2A through 9.

The semiconductor device 2 may have improved electric characteristic without it being necessary to perform an additional operation.

Figure 11:
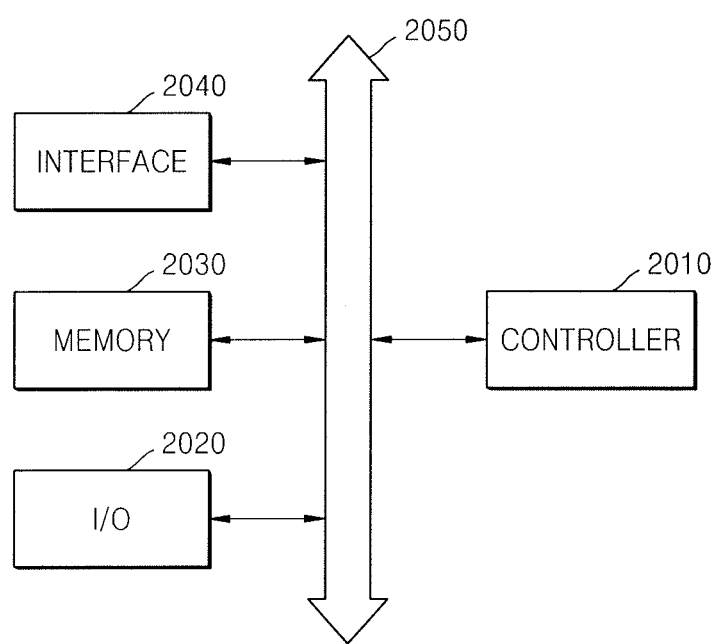
FIG. 11 illustrates a block diagram of an electronic system according to an embodiment.

FIG. 11 illustrates a block diagram of an electronic system 2000 according to an embodiment.

The electronic system 2000 may include a controller 2010, an input/output device (I/O) 2020, a memory 2030, and an interface 2040, which are connected to each other through a bus 2050.

The controller 2010 may include at least one of a microprocessor, a digital signal processor, and a similar processing apparatus. The I/O 2020 may include at least one of a keypad, a keyboard, and a display. The memory 2030 may store commands to be executed by the controller 2010. In an implementation, the memory 2030 may store user data.

The electronic system 2000 may form a wireless communication apparatus or an apparatus capable of transmitting and/or receiving information under a wireless environment. The interface 2040 may form a wireless interface such that the electronic system 2000 may transmit/receive data through a wireless communication network. The interface 2040 may include an antenna and/or a wireless transceiver. In an implementation, the electronic system 2000 may use a communication interface protocol of the third generation, such as code division multiple access (CDMA), global system for mobile communications (GSM), north American digital cellular (NADC), extended-time division multiple access (E-TDMA), or wide band code division multiple access (WCDMA). The electronic system 2000, e.g., at least one of the controller 2010 and the memory 2030, may include at least one of a semiconductor device according to an embodiment described above and a semiconductor device that may modified or changed within the scope of the embodiments.

By way of summation and review, due to the characteristics of a conductor, embedding the conductor in a via hole having a high aspect ratio could be poor. In view of the increased integration degree of semiconductor circuits, a method according to an embodiment of embedding a conductor having an excellent electric characteristic in a via hole having a high aspect ratio may be performed without having to perform an additional operation.

The embodiments may provide a semiconductor device having improved electrical characteristics without performing an additional operation.

The embodiments may provide an electronic system capable having an improved electric characteristic without performing an additional operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a semiconductor substrate having a first region and a second region;
a magnetic tunnel junction in the first region, the magnetic tunnel junction including a lower magnetic structure, a tunnel barrier, and an upper magnetic structure that are sequentially stacked;
a first via plug in the second region, the first via plug including a same material as the lower magnetic structure; and
a conductor wire on the first via plug,
wherein a height of the lower magnetic structure of the first region is substantially equal to a height of the first via plug of the second region.

2. The semiconductor device as claimed in claim 1, wherein a lower surface of the lower magnetic structure of the first region is substantially coplanar with a lower surface of the first via plug of the second region.

3. The semiconductor device as claimed in claim 1, wherein an upper surface of the lower magnetic structure of the first region is substantially coplanar with an upper surface of the first via plug of the second region.

4. The semiconductor device as claimed in claim 1, wherein the tunnel barrier includes magnesium oxide.

5. The semiconductor device as claimed in claim 1, wherein:
the conductor wire is a second via plug that includes a material different from that of the first via plug, and
the first via plug and the second via plug directly contact each other.

6. The semiconductor device as claimed in claim 5, wherein a diameter of the first via plug and a diameter of the second via plug are different from each other.

7. The semiconductor device as claimed in claim 1, wherein:
the conductor wire is a horizontal line wire that includes a material different from that of the first via plug, and
the first via plug and the horizontal line wire directly contact each other.

8. The semiconductor device as claimed in claim 1, further comprising a spacer on a sidewall of the first via plug.

9. The semiconductor device as claimed in claim 1, wherein the first region is a memory region and the second region is a logic region.

10. The semiconductor device as claimed in claim 1, wherein at least one of the tunnel barrier and upper magnetic structure is not present in the second region.

11. A semiconductor device, comprising:
a select element;
a memory element electrically connected to the select element;
a logic device; and
a via plug electrically connected to the logic device,
wherein:
the memory element includes a lower magnetic structure, a tunnel barrier, and an upper magnetic structure,
the via plug includes substantially the same material as the lower magnetic structure, and
a height of the lower magnetic structure and a height of the via plug are substantially equal to each other.

12. The semiconductor device as claimed in claim 11, further comprising:
a first spacer on a sidewall of the memory element; and
a second spacer on a sidewall of the via plug, wherein the first spacer and the second spacer are formed of a same material.

13. The semiconductor device as claimed in claim 12, wherein a bottom width of the first spacer and a bottom width of the second spacer are substantially equal to each other.

14. An electronic system, comprising:
a controller;
an input/output to input and output data;
a memory to store data;
an interface to exchange data with an external device; and
a bus to connect the controller, the input/output, the memory, and the interface to communicate with each other,
wherein at least one of the controller and the memory includes the semiconductor device as claimed in claim 1.

15. A semiconductor device, comprising:
a substrate that includes a memory region and a logic region;
a select element on the memory region of the substrate;
a memory element electrically connected to the select element;
a logic device on the logic region of the substrate; and
a first via plug electrically connected to the logic device, wherein:
the memory element includes a lower magnetic structure, a tunnel barrier, and an upper magnetic structure,
the first via plug has substantially the same structure as the lower magnetic structure,
the logic region of the substrate does not include the tunnel barrier or the upper magnetic structure thereon, and
a height of the lower magnetic structure of the first region is substantially equal to a height of the first via plug of the second region.

16. The semiconductor device as claimed in claim 15, further comprising:
a first spacer on a sidewall of the memory element; and
a second spacer on a sidewall of the first via plug,
wherein the first spacer and the second spacer are formed of a same material.

17. The semiconductor device as claimed in claim 16, wherein a bottom width of the first spacer and a bottom width of the second spacer are substantially equal to each other.

18. The semiconductor device as claimed in claim 15, further comprising a conductor wire directly contacting the first via plug.

19. The semiconductor device as claimed in claim 18, wherein:
the conductor wire is a second via plug that includes a material different from that of the first via plug, or
the conductor wire is a horizontal line wire that includes a material different from that of the first via plug.

* * * * *